United States Patent
Papa Rao et al.

(10) Patent No.: US 6,900,127 B2
(45) Date of Patent: May 31, 2005

(54) MULTILAYER INTEGRATED CIRCUIT COPPER PLATEABLE BARRIERS

(75) Inventors: Satyavolu S. Papa Rao, Garland, TX (US); Stephan Grunow, Dallas, TX (US); Noel M. Russell, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/649,256

(22) Filed: Aug. 27, 2003

(65) Prior Publication Data

US 2005/0048776 A1 Mar. 3, 2005

(51) Int. Cl.⁷ ............................................... H01L 21/44
(52) U.S. Cl. ........................ 438/678; 438/680; 438/681; 438/686; 438/687; 438/650
(58) Field of Search ............................... 438/650, 678, 438/680, 681, 686, 687

(56) References Cited

U.S. PATENT DOCUMENTS 6,074,945 A * 6/2000 Vaartstra et al. ............ 438/681
6,518,668 B2 * 2/2003 Cohen ........................ 257/751
2002/0015855 A1   2/2002 Sajoto et al.
2002/0185671 A1 * 12/2002 Kim ............................ 257/301
2004/0028882 A1 * 2/2004 Andricacos et al. ........ 428/209

OTHER PUBLICATIONS

Stanley Wolf, Silicon Processing for the VLSI ERA, 1986, vol. 1, pp. 335–353.*

* cited by examiner

*Primary Examiner*—Thanh Nguyen
(74) *Attorney, Agent, or Firm*—Peter K. McLarty; W. James Brady, III; Frederick J. Telecky, Jr.

(57) ABSTRACT

A trench (70) is formed in a dielectric layer (20). A first metal layer (80) is formed in the trench using physical vapor deposition. A second metal layer (100) is formed in the trench (70) over the first metal layer (80) using chemical vapor deposition. Copper (110) is used to fill the trench (70) by electroplating copper directly onto the second metal (100).

5 Claims, 3 Drawing Sheets

MULTILAYER INTEGRATED CIRCUIT COPPER PLATEABLE BARRIERS

FIELD OF THE INVENTION

The present invention relates to integrated circuit fabrication and more particularly to a method for forming thin barrier layers that are directly plateable with copper.

BACKGROUND OF THE INVENTION

Copper is used extensively to form the metal interconnect lines in integrated circuits. The metal interconnect lines are used to interconnect the electronic devices formed in the semiconductor material. These electronic devices include transistors, capacitors, inductors, and resistors. The metal interconnect lines are formed in dielectric layers that are formed above the semiconductor material. Copper lines are formed using a damascene type process. In a damascene process trenches are first formed in the dielectric layers. A barrier layer is then formed in trench. The barrier layer is necessary to prevent the diffusion of copper into the dielectric layer. Typical barrier layers include titanium nitride, tantalum, tantalum nitride, and other suitable material. A copper seed layer is then formed on the barrier layer using a physical vapor deposition (PVD) process. Electrochemical deposition (ECD) is then used to fill the remaining opening in the trench with copper. Electrochemical deposition (ECD), also known as electroplating, allows "superconformal" film formation, leading to defect-free fill of patterned structures. A potential is applied between two electrodes (anode, cathode) that are immersed into a conductive solution (electrolyte) containing copper (Cu) ions. ECD requires a conductive surface (cathode) to reduce Cu2+ to Cu0 and initiate nucleation and growth of Cu. Therefore, a thin layer of Cu seed is typically deposited across the entire wafer surface/features prior to ECD, serving as cathode during ECD Cu. Provided a conformal Cu seed layer, uniform potential (current), and sufficient Cu2+ concentration (electron-transfer controlled deposition) within patterned structures, ECD allows for conformal film formation and feature fill. "Superconformal" film formation and feature fill ("superfill") can be achieved by the use of additives that lead to a higher deposition rate at the bottom than on the sidewall of patterned features. Additives are also known to influence ECD Cu recrystallization processes that occur at room temperature. During this room-temperature self-annealing (RTSA), an increase in ECD Cu grain size (and an enhancement in crystallinity) has been observed over time at room temperature along with a decrease in film resistivity and (compressive) stress. For direct-plating of ECD Cu on ("seedless") barrier materials, potential (current) wave forms as well as electrolyte composition (e.g., sulfate-, fluoroborate-, citrate-, or ethylenediaminetetraacetate-based chemistries, etc.) and type of additives need to be tailored to achieve optimal deposition conditions for ECD Cu nucleation and growth.

The copper seed layer is necessary because copper will not electroplate directly to the typical barrier layers. An example of a trench is shown in FIG. 1(a). The electronic devices in the semiconductor 10 have been omitted for clarity. As described above, a dielectric 20 is formed above the semiconductor 10. A barrier layer 30 and a copper seed layer 40 are formed in the trench 5 prior to the filling of the trench 5 with copper 50.

As devices dimensions shrink the width of the trench used to form the copper lines will also shrink. Shown in FIG. 1(b) is the case of a trench 7 with reduced width. The barrier layer 30 and copper seed layer 40 are formed in the trench 7 as shown in the Figure. These layers reduce the width of the trench prior to the filling of the trench using copper electroplating. During the electroplating process the narrow opening of the trench often leads to the creating of voids 60 in the copper 50. The presence of such voids 60 in the copper 50 will increase the resistance of the interconnect lines and lead to unreliable integrated circuit performance. There is therefore a great need for a method of forming copper interconnect lines in narrow trenches without forming voids. The instant invention addresses this need.

SUMMARY OF INVENTION

The instant invention comprises a method for platable barriers for forming copper interconnect structures in integrated circuit manufacturing. The method comprises forming a dielectric layer over a semiconductor substrate. A PVD metal layer is formed in the trench using a metal comprising a high atomic number such as Ruthenium, Iridium, or Rhodium that have conductive oxides or are resistant to oxidation. In an embodiment of the invention a plasma treatment can be applied to the first metal layer following formation. A second metal layer with a high atomic number is formed in the trench over said first metal layer using chemical vapor deposition. Copper is used to fill the trench by electroplating copper directly unto the second metal layer. In further embodiment of the instant invention additional metal layers can be formed between the first metal layer and the second metal layer.

THE DRAWINGS

For a more complete understanding of the present invention and the advantages thereof, reference is now made to the following description taken in conjunction with the accompanying drawings, wherein like reference numerals represent like features, in which:

FIG. 1(a) and FIG. 1(b) are cross-sectional diagrams showing copper structures according to the prior art.

FIG. 2(a) and FIG. 2(b) are cross-sectional diagrams showing copper structures according to an embodiment of the instant invention.

DETAILED DESCRIPTION OF THE INVENTION

Figure 1A:
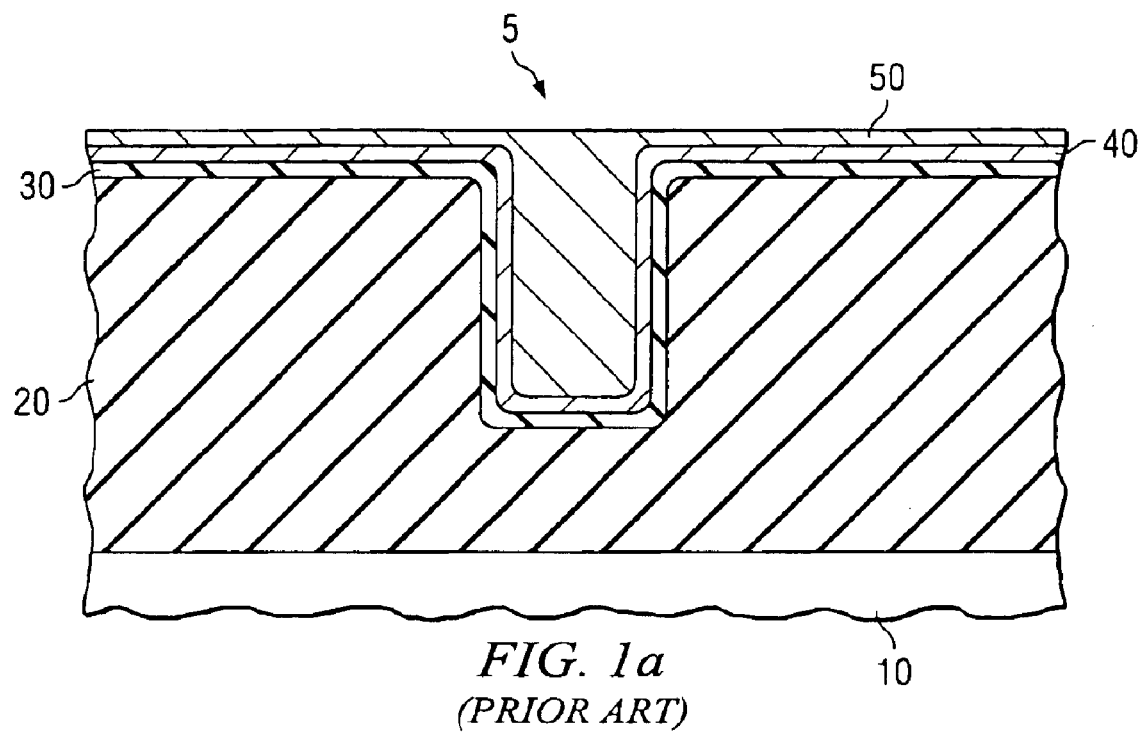
Figure 1B:
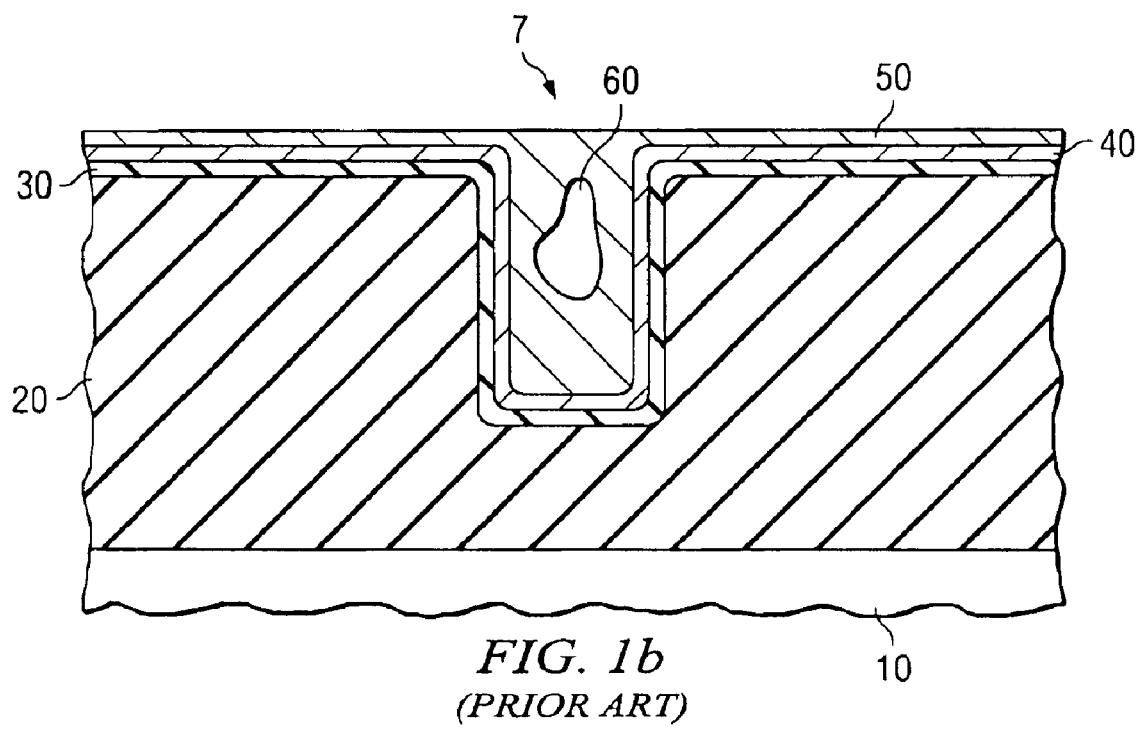
Figure 2A:
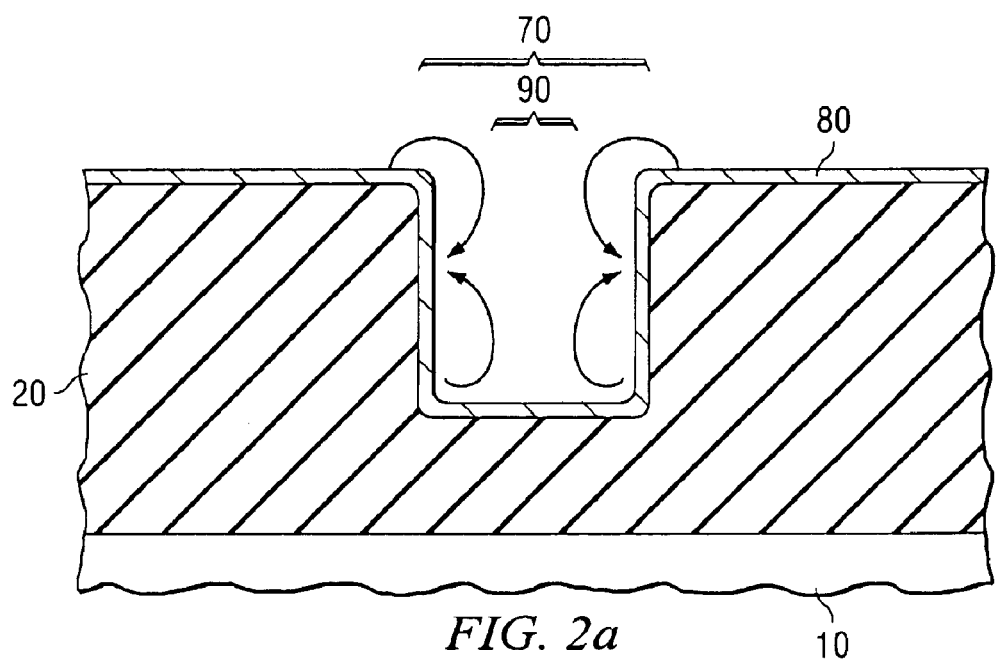
Figure 2B:
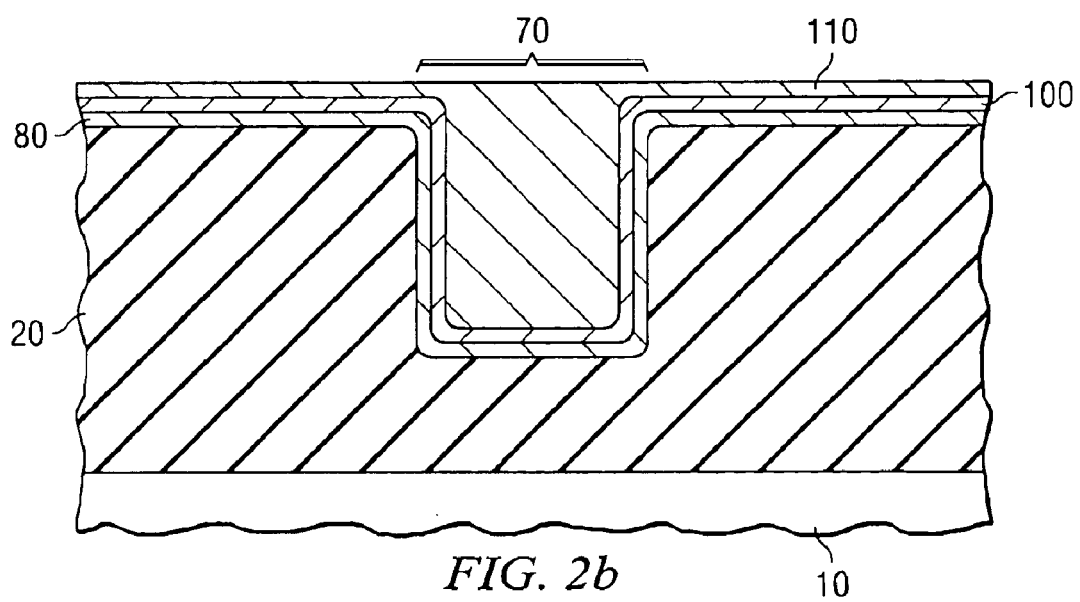

Illustrated in FIGS. 2(a) and 2(b) are integrated circuit plateable copper barriers according to an embodiment of the instant invention. As shown in FIG. 2(a), a dielectric layer 20 is formed over a semiconductor 10. Electronic devices such as transistors, capacitors, resistors, etc are formed in the semiconductor and are omitted from the Figures for clarity. The dielectric layer 20 can comprise silicon oxide or any other suitable dielectric material including spin-on-glasses (SOG), xerogels, and other low K dielectric material. There can be any number of additional layers formed between the semiconductor 10 and the dielectric layer 20. Such layers have been omitted from the Figures for clarity. A trench 70 is formed in the dielectric layer using known methods. A thin layer 80 comprising a high atomic number metal (particularly those forming conductive metal oxides) such as Ruthenium (Ru), Iridium (Ir), Rhodium (Rh), and Palladium (Pd) is formed in the trench 70 using methods such as physical vapor deposition (PVD). A description of the PVD process can be found in reference books such as VLSI Technology by S. M. Sze. A brief summary of the PVD process taken from VLSI Technology is presented below. In general, the PVD method deposits a material on a surface away from a source using three main steps; (1) converting the condensed solid phase (generally a solid) into a gaseous or vapor phase, (2) transporting the gaseous phase from the source to the surface, and (3) condensing the gaseous source on the surface, followed by the nucleation and growth of the layer. For the formation of metal layers using PVD a metal target is vaporized by sputtering the target using plasma excitation. The metal particles that comprise the metal vapor are then transported to the surface to form the metal layer. For this invention high atomic number is taken to mean any metal with an atomic number greater than 36. In a first embodiment less than 50 angstroms of a metal comprising Ru is formed (or deposited) in the trench using PVD. The PVD deposition of the metal comprising Ru can be performed in a suitable PVD chamber using a plasma excitation power of 100 to 1000 watts with a DC power of 5 KW to 30 KW applied to the sputter metal target or targets. Following formation of the high atomic number metal layer 80, an optional redistribution plasma treatment can be performed to redistribute the metal on the surface of the trench 90. In an embodiment, this redistribution plasma treatment comprises exposing the metal 80 to a low power plasma with excitation power levels of less than 1000 Watts.

Following the formation of the first thin high atomic number metal 80, a second high atomic number metal layer 100 comprising Ruthenium (Ru), Iridium (Ir), Rhodium (Rh), and Palladium (Pd) is formed on the first layer 80 using methods such as chemical vapor deposition (CVD). The nucleation step of CVD processes is sensitive to the surface on which the deposition occurs; and can lead to rougher films if the nucleation density is low. This can potentially lead to copper fill problems. In an embodiment, the second metal layer 100 comprises a Ru containing metal formed (or deposited) using chemical vapor deposition (CVD). The CVD deposition of a Ru containing metal comprises vaporizing an organometallic containing Ru and flowing the Ru containing vapor in a carrier gas such as argon or nitrogen over a surface heated to between 100° C. and 350° C.

Following the formation of the second metal layer 100, a metal comprising copper 110 is used to fill the trench. In an embodiment, copper is electroplated directly onto the second metal layer 100 without the need for the formation of a seed layer. In the electroplating of copper, a voltage is applied to the second metal layer 100 while the structure is placed in an electrolytic solution comprising copper ions. The copper ions will be attracted to the surface of the second metal layer 100 and copper metal 110 will fill the trench 70.

Figure 3:
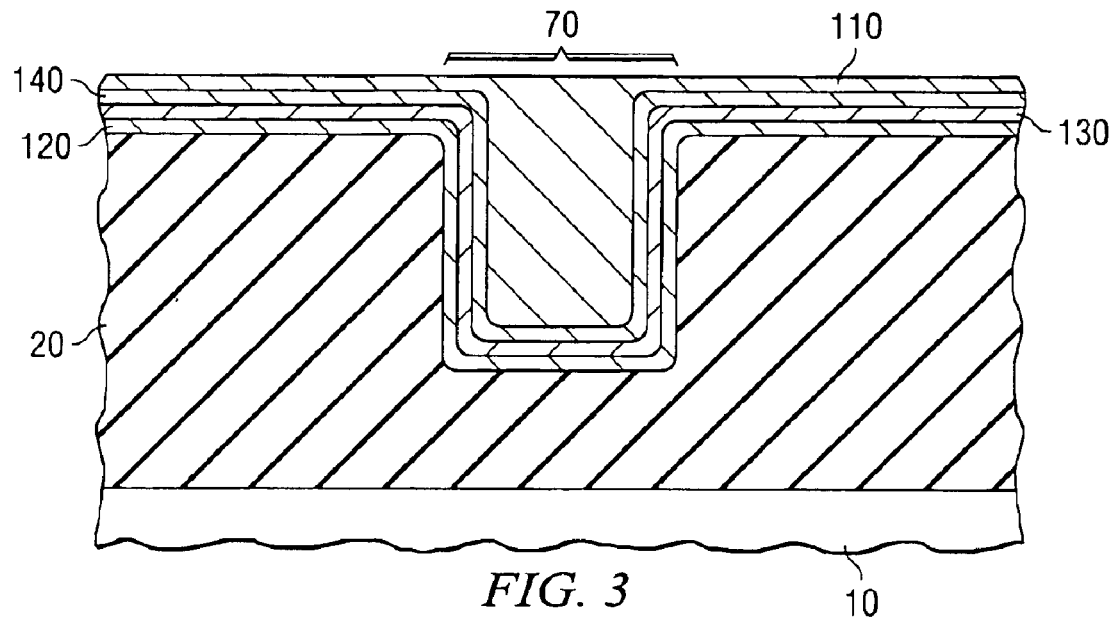
FIG. 3 is a cross-sectional diagram showing a copper structure according to an embodiment of the instant invention.

Shown in FIG. 3 is a further embodiment of the instant invention. A first metal layer 120 is formed in the trench 70. The metal layer can be formed using either PVD or CVD techniques. A second metal layer 130 is formed on the first metal layer 120. The second metal layer can be formed from a high atomic number metal using PVD or CVD. In an embodiment, the first and second metal layers 120 and 130 can comprise Ruthenium (Ru), Iridium (Ir), Rhodium (Rh), and/or Palladium (Pd). Although only two layers of metal are shown (i.e. 120 and 130), any number of metal layers can be formed using PVD or CVD without departing from the scope of the instant invention. Following the formation of the metal layers 120, and 130, a third metal layer 140 is formed. In an embodiment, the third metal layer comprises a high atomic number metal such as Ruthenium (Ru), Iridium (Ir), Rhodium (Rh), and/or Palladium (Pd) formed using CVD. Following the formation of the third metal layer 140, a metal comprising copper 110 is used to fill the remaining opening in the trench 70. In an embodiment, copper metal is electroplated directly unto the surface of the third metal layer 140 without the need for the formation of a copper seed layer.

Figure 4:
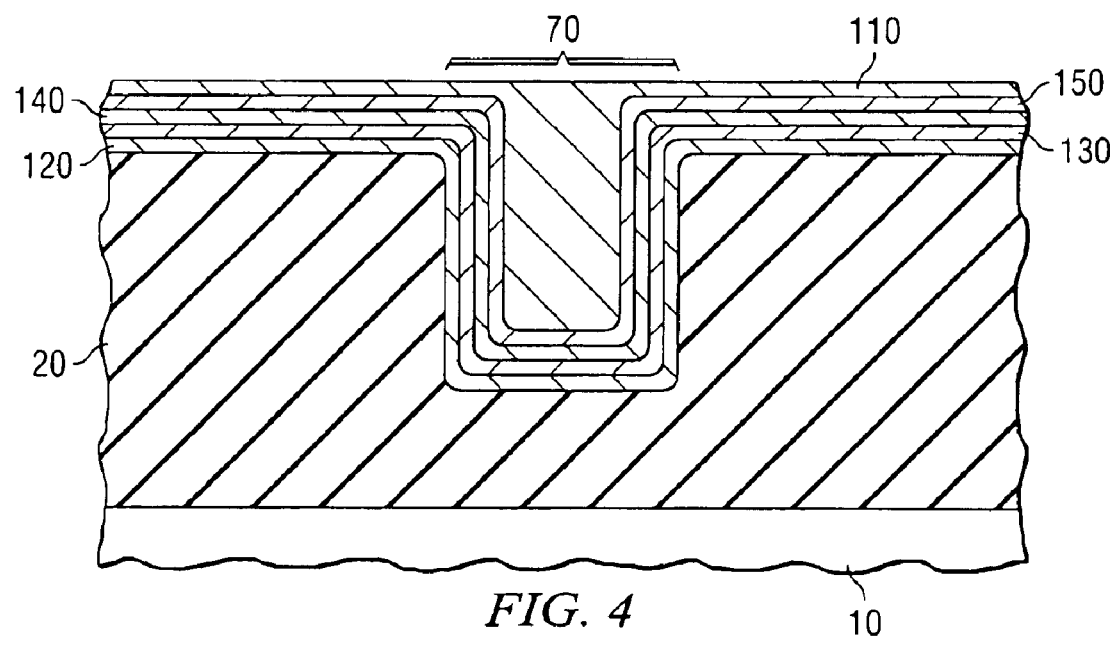
FIG. 4 is a cross-sectional diagram showing a copper structure according to an embodiment of the instant invention.

Shown in FIG. 4 is a further embodiment of the instant invention. A first metal layer 120 is formed in the trench 70. The metal layer can be formed using either PVD or CVD techniques. A second metal layer 130 is formed on the first metal layer 120. The second metal layer can be formed from a high atomic number metal using PVD or CVD. In an embodiment the first and second metal layers 120 and 130 can comprise Ruthenium (Ru), Iridium (Ir), Rhodium (Rh), and/or Palladium (Pd). Although only two layers of metal are shown (i.e. 120 and 130), any number of metal layers can be formed using PVD or CVD without departing from the scope of the instant invention. Following the formation of the metal layers 120, and 130, a third metal layer 140 is formed. In an embodiment, the third metal layer comprises a high atomic number metal such as Ruthenium (Ru), Iridium (Ir), Rhodium (Rh), and/or Palladium (Pd) formed using CVD. Following the formation of the third metal layer 140, a fourth metal layer 150 is formed on the third metal layer 140. In an embodiment, the fourth metal layer 150 comprises a high atomic number metal such as Ruthenium (Ru), Iridium (Ir), Rhodium (Rh), and/or Palladium (Pd) formed using CVD techniques. Following the formation of the fourth metal layer 150, a metal comprising copper 110 is used to fill the remaining opening in the trench 70. In an embodiment, copper metal is electroplated directly unto the surface of the fourth metal layer 150 without the need for the formation of a copper seed layer. Although only two CVD metal layers 140 and 150 are shown in the Figure, any number of CVD metal layers can be formed without departing from the scope of the instant invention.

While this invention has been described with reference to illustrative embodiments, this description is not intended to be construed in a limiting sense. Various modifications and combinations of the illustrative embodiments, as well as other embodiments of the invention will be apparent to persons skilled in the art upon reference to the description. It is therefore intended that the appended claims encompass any such modifications or embodiments.

We claim:

1. A method for forming integrated circuit copper lines, comprising:

forming a trench in a dielectric layer;

forming a first metal layer in said trench using physical vapor deposition and a high atomic number metal wherein said high atomic number metal is selected from a group consisting of Ruthenium, Iridium, and Rhodium;

forming a second metal layer in said trench contacting on said first metal layer using chemical vapor deposition and a high atomic number metal wherein said high atomic number metal is selected from a group consisting of Ruthenium, Iridium, and Rhodium; and filling said trench with copper by electroplating copper directly on said second metal layer.

2. The method of claim 1 wherein said forming a first metal layer in said trench comprises forming a Ruthenium layer using a plasma excitation power of 100 to 1000 watts with a DC power of 5 KW to 30 KW applied to a sputter metal target.

3. The method of claim 1 wherein said forming a second metal layer in said trench comprises flowing a vapor containing Ruthenium over a surface heated to between 100° C. and 350° C.

4. The method of claim 1 further comprising forming a third metal layer in said trench contacting on said second metal layer using chemical vapor deposition and a metal selected from a group consisting of Ruthenium, Iridium, and Rhodium.

5. The method of claim 4 further comprising forming a fourth metal layer in said trench contacting said third metal layer using chemical vapor deposition and a high atomic number metal.

* * * * *